(12) United States Patent
Mastromauro et al.

(10) Patent No.: US 11,609,402 B2
(45) Date of Patent: Mar. 21, 2023

(54) ELECTRONIC DEVICE COMPRISING AN OPTICAL CHIP AND METHOD OF FABRICATION

(71) Applicants: STMicroelectronics (Grenoble 2) SAS, Grenoble (FR); STMicroelectronics (Research & Development) Limited, Marlow (GB)

(72) Inventors: Nicolas Mastromauro, Lumbin (FR); Roy Duffy, Edinburgh (GB); Karine Saxod, Les Marches (FR)

(73) Assignees: STMicroelectronics (Grenoble 2) SAS, Grenoble (FR); STMicroelectronics (Research & Development) Limited, Marlow (GB)

( * ) Notice: Subject to any disclaimer, the term of this patent is extended or adjusted under 35 U.S.C. 154(b) by 732 days.

(21) Appl. No.: 16/573,023

(22) Filed: Sep. 17, 2019

(65) Prior Publication Data
US 2020/0096720 A1 Mar. 26, 2020

(30) Foreign Application Priority Data
Sep. 25, 2018 (FR) ...................................... 1858737

(51) Int. Cl.
*H01L 31/0232* (2014.01)
*H01L 31/0203* (2014.01)
(Continued)

(52) U.S. Cl.
CPC ............. *G02B 7/006* (2013.01); *G02B 13/00* (2013.01); *H01L 31/0203* (2013.01); *H01L 31/02325* (2013.01)

(58) Field of Classification Search
CPC ..... G02B 7/006; G02B 13/00; H01L 31/0203; H01L 31/02325
(Continued)

(56) References Cited

U.S. PATENT DOCUMENTS

| 2004/0061799 A1 | 4/2004 | Atarashi et al. |
| 2005/0035421 A1 | 2/2005 | Kayanuma et al. |

(Continued)

FOREIGN PATENT DOCUMENTS

WO 2008093463 A1 8/2008

OTHER PUBLICATIONS

INPI Search Report and Written Opinion for FR 1858737 dated Jun. 17, 2019 (9 pages).

*Primary Examiner* — Duy T Nguyen
(74) *Attorney, Agent, or Firm* — Crowe & Dunlevy

(57) ABSTRACT

An electronic device includes a carrier substrate having a front face. An electronic chip is mounted on the front face of the carrier substrate and includes an optical component. An encapsulation cover is mounted on top of the front face of the carrier substrate and bounds a chamber within which the chip is situated. A front opening extends through the cover and is situated in front of the optical component. An optical element, designed to allow light to pass, is mounted within the chamber at a position which covers the front opening of the encapsulation cover. The optical element includes a central region designed to deviate the light and having an optical axis aligned with the front opening and the optical component. A positioning pattern is provided on the optical element to assist with mounting the optical element to the cover and mounting the cover to the carrier substrate.

19 Claims, 2 Drawing Sheets

(51) Int. Cl.
*G02B 7/00* (2021.01)
*G02B 13/00* (2006.01)
(58) Field of Classification Search
USPC .......................................................... 257/99
See application file for complete search history.

(56) References Cited

U.S. PATENT DOCUMENTS

| 2005/0099659 A1 | 5/2005 | Wu et al. |
| 2006/0006486 A1 | 1/2006 | Seo et al. |
| 2006/0016973 A1* | 1/2006 | Yang ................... H01L 31/0203 |
| | | 257/E31.118 |
| 2007/0108561 A1* | 5/2007 | Webster ............ H01L 27/14618 |
| | | 257/666 |
| 2007/0126081 A1 | 6/2007 | Webster et al. |
| 2009/0266988 A1 | 10/2009 | Honda et al. |
| 2010/0053388 A1* | 3/2010 | Kobayashi ............. H04N 1/024 |
| | | 348/294 |
| 2011/0086461 A1 | 4/2011 | Bolis |
| 2017/0052063 A1 | 2/2017 | Lai et al. |

* cited by examiner

ELECTRONIC DEVICE COMPRISING AN OPTICAL CHIP AND METHOD OF FABRICATION

PRIORITY CLAIM

This application claims the priority benefit of French Application for Patent No. 1858737, filed on Sep. 25, 2018, the content of which is hereby incorporated by reference in its entirety to the maximum extent allowable by law.

TECHNICAL FIELD

The present invention relates to the field of microelectronics and, more particularly, that of electronic housings comprising encapsulation covers of electronic chips mounted on carrier wafers.

SUMMARY

In an embodiment, an electronic device comprises: a carrier substrate having a front mounting face; an electronic chip mounted on the front mounting face of the carrier substrate and having, in its front face, an optical component; an encapsulation cover of the chip, which is mounted on top of the front face of the carrier substrate, which bounds a chamber within which the chip is situated and which has a front opening situated in front of the optical component of the chip; and an optical element, designed to allow light to pass, which covers the front opening of the encapsulation cover and which is mounted on the encapsulation cover on the same side as the chip.

Thus, the assembly is facilitated and precise.

The optical element may comprise a positioning pattern on the same side as the chip.

The optical element may comprise a base wafer and a back layer situated on the same side as the chip and having a central region designed to deviate the light and a positioning pattern.

The encapsulation cover may have, around the through passage, a back mounting face which comprises at least one contact area on which a front face of the optical element is resting and which comprises at least one local cavity which is recessed with respect to the contact area, this local cavity, on the one hand, forming spaces between the front face of the optical element and the bottom of the local cavity and, on the other hand, extending and being uncovered beyond one edge of the optical element.

At least one drop of adhesive for fixing the optical element may extend locally into the local cavity.

The drop of adhesive may have a covered portion between the local cavity and the optical element and an uncovered portion which extends beyond the edge of the optical element, The bottom of the local cavity may have a protruding boss which extends facing and at a distance from the front face of the optical element, the drop of fixing adhesive extending over this protruding boss.

The protruding boss may have a portion covered by the optical element and an uncovered portion situated beyond the edge of the optical element.

The local cavity may be situated at a distance from the through passage and separated from this through passage by the contact area.

The optical element may comprise a base wafer and a back layer including a central part designed to deviate the light and a detectable positioning pattern.

In an embodiment, a method of fabricating an electronic device comprises: providing, on the one hand, a carrier substrate on a front face of which at least one electronic chip is mounted comprising an optical component and, on the other hand, an encapsulation cover having a front opening and an optical element through which light is able to pass; mounting the optical element on the encapsulation cover, behind the front opening; and mounting the encapsulation cover on top of the front face of the carrier substrate, in a position such that the chip is situated in a chamber bounded by the encapsulation cover and that the optical element is in front of the optical component of the chip, the optical axes of the optical component of the chip and of the optical element being situated on a common optical axis.

The mounting of the encapsulation cover may comprise: placing the encapsulation cover equipped with the optical element in a reference position; detecting a positioning pattern of the optical element through the back of the encapsulation cover, with respect to a position of the carrier substrate or of the chip mounted on the carrier substrate; and moving and mounting the encapsulation cover on top of the carrier substrate, starting from the reference position and according to a movement and mounting program.

BRIEF DESCRIPTION OF THE DRAWINGS

Electronic devices will now be described by way of non-limiting exemplary embodiments, illustrated by the drawing in which.

DETAILED DESCRIPTION

Figure 1:
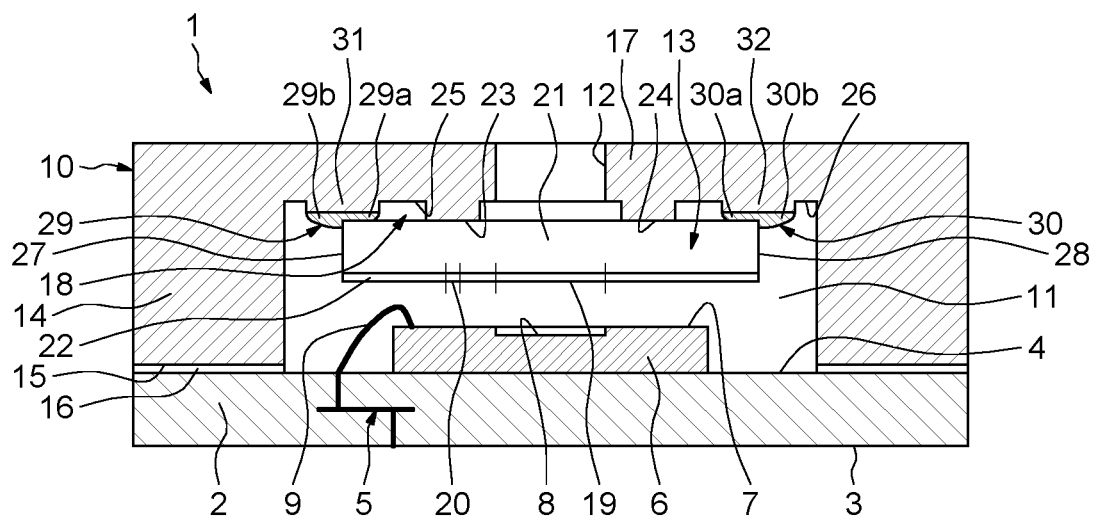
FIG. 1 shows a longitudinal cross-section of an electronic device

An electronic device 1, illustrated in the figures, comprises a carrier substrate 2, in the form of a wafer, which has a back face 3 and a front mounting face 4 and which includes an integrated network 5 of electrical connections from one face to the other. The carrier substrate 2 is made of an opaque material.

The electronic device 1 comprises an electronic chip 6 which is fixed onto the front face 4 of the carrier substrate 2, by means of a layer of adhesive (not shown) and which comprises, in its front face 7, an optical component 8 designed to emit or to receive light radiation. The chip 6 is electrically connected to the network of electrical connections 5, for example, by one or more electrical wires 9.

The electronic device 1 comprises an encapsulation cover 10 which is fixed on top of the front face 4 of the carrier substrate 2 and which bounds a chamber 11 inside of which the chip 6 is situated. The encapsulation cover 10 is made of an opaque material.

The encapsulation cover 10 has a local front opening 12 situated in front of the optical component 8 of the chip 6.

The electronic device 1 comprises an optical element 13, designed to allow light radiation to pass through, in the form of a wafer, which is disposed within the chamber 11 in front of the chip 6 and which is fixed to the encapsulation cover 10 so as to cover the front opening 12.

Advantageously, the encapsulation cover 10 comprises a peripheral wall 14 whose back edge 15 is fixed on top of the periphery of the front face 4 of the carrier substrate 2, by means of a bead of adhesive 16, and a forward frontal wall 17 which has the front opening 12 and which has, around the front opening 12, a back face 18 for mounting the optical element 13.

The optical element 13 has a central region 19 designed to deviate the light and a positioning pattern 20. Advantageously, the central region 19 and the positioning pattern 20 are on the back side of the optical element 13, in other words on the same side as the chip 6.

The optical axes of the optical component 8 of the chip 6 and of the central region 19 of the optical element 13 and the axis of the local front opening 12 of the encapsulation cover 10 are situated on a common optical axis, so as to obtain a correct alignment, this common optical axis being perpendicular to the front face of the chip 6 and to the carrier substrate 2. The local front opening 12 of the encapsulation cover 10 forms an optical interface.

According to one variant embodiment, the optical element 13 comprises a base wafer 21, for example made of glass, and, on a back face of this base wafer 21, in other words on the same side as the chip 6, a back layer 22 of structured polymer in order to form the central region 18 designed to deviate the light and the positioning pattern 19.

Optionally, the optical element 13 comprises a front layer (not shown), designed to form a filter, for example a UV filter.

In the case where the optical component 8 of the chip 6 is an emitter of light, the central region 18 of the layer 22 of the optical element 13 is advantageously designed to produce a multidirectional dispersion, towards the outside through the wafer 21 and the local front opening 12 of the encapsulation cover 10.

In the case where the optical component 8 of the chip 6 is a receiver of light, the central region 18 of the layer 22 of the optical element 13 advantageously forms a converging optical lens designed to make the light coming from the outside through the local front opening 12 of the encapsulation cover 10 and of the wafer 21 converge towards the optical component 8.

According to one variant embodiment, the internal back mounting face 18 of the frontal wall 17 comprises local contact surfaces 23 and 24 on which the front face of the optical element 13 is resting. Since the optical element 13 is disposed in a longitudinal direction, the local contact surfaces 23 and 24 are situated longitudinally on either side of the local opening 12 and join opposite sides of the peripheral wall 14.

The mounting face 18 of the frontal wall 17 comprises, on longitudinally opposing regions with respect to the through passage 4 and to the local contact surfaces 23 and 24, local cavities 25 and 26 recessed or in a dip with respect to the contact surfaces 23 and 24. These local cavities 25 and 26 form spaces between the front face of the optical element 13 and the bottoms of the cavities 25 and 26 and extend and are uncovered beyond opposite edges 27 and 28 of the optical element 13, in other words not covered by the optical element 13.

The optical element 13 is fixed to the frontal wall 3 by means of local drops of fixing adhesive 29 and 30 which extend locally into the cavities 25 and 26 and which respectively have portions 29*a* and 30*a* covered by end parts of the optical element 5, adjacent to opposing edges 13 and 14 of the optical element 5, and uncovered portions 29*b* and 30*b* situated beyond opposing edges 27 and 28 of the optical element 5.

Advantageously, the bottoms of the cavities 25 and 26 have protruding bosses 31 and 32 which are situated at a distance from the edges of the cavities 25 and 26 and which have end faces which extend facing and at a distance from the front face of the optical element 13 and which extend beyond opposing edges 27 and 28 of the optical element 13.

The drops of adhesive 29 and 30 are situated on the protruding bosses 31 and 32. Nevertheless, the drops of adhesive 29 and 30 may spill over beyond the edge of the protruding bosses 31 and 32. Advantageously, the drops of adhesive 29 and 30 do not reach the contact surfaces 23 and 24.

The recessed spaces, situated between the contact surfaces 24 and 25 and passing underneath the optical element 13, form ventilation or aeration channels for the chamber 11.

The electronic device 1 may be fabricated in the following manner.

Provide, on the one hand, a carrier substrate 2 on which a chip 6 is mounted and electrically connected and further provide, on the other hand, a prefabricated encapsulation cover 10, for example obtained by an injection process, and an optical element 13.

Using a syringe, drops of adhesive 29 and 30, in the liquid state, are locally dispensed in the hollowed out cavities 25 and 26 of the mounting internal back face 18 of the encapsulation cover 10. More precisely, drops of adhesive 29 and 30 are dispensed on the ends of the protruding bosses 31 and 32. By virtue of the capillarity effects, the drops of adhesive 29 and 30 have a tendency to stay on the protruding bosses 31 and 32 and do not flow away towards the rest of the cavities 25 and 26. In particular, the drops of adhesive 16 and 17, in the liquid state, do not reach the contact surfaces 23 and 24. The drops of adhesive are, for example, composed of an epoxy material.

By means of a transfer and positioning tool, via the back of the encapsulation cover 10, the optical element 13 resting on the contact surfaces 23 and 24 is installed, placing the axis of the central region 19 designed to deviate the light of the optical element 13 along the axis of the front opening 12 and placing the positioning pattern 20 according to a desired position for the orientation of the optical element 13 with respect to the encapsulation cover 10 or the axis of the central region 19 designed to deviate the light of the optical element 13. This operation is carried out by visually detecting the positioning pattern 17 through the back of the encapsulation cover 10. By doing so, the end parts of the optical element 13, adjacent to its edges 27 and 28, squash the drops of adhesive 29 and 30 so as to form their covered portions 29*a* and 30*a* and the uncovered portions 19*b* and 30*b*.

Immediately while it is being held, a step for local tacking of the optical element 13 onto the encapsulation cover 10 is carried out by means of a first piece of equipment (not shown).

For example, the transfer and positioning tool being equipped with a device designed to emit ultraviolet radiation, this emission is temporarily activated in the direction of the uncovered portions 29*b* and 30*b* of the drops of adhesive 29 and 30, in such a manner as to make the drops of adhesive 29 and 30 harden, at least partially, and to cause local tacking points of the optical element 13 on the cover 10.

Subsequently, the transfer and positioning tool is removed.

In a further step, a definitive fixing of the optical element 13 onto the cover 10 is carried out, by means of a second piece of equipment (not shown). For example, the encapsulation cover 10 is transferred into a curing oven, so as to make the drops of adhesive 29 and 30 completely harden, at a suitable temperature, and to cause a complete fixing of the optical element 13 onto the cover 10.

It goes without saying that the chosen adhesive is designed to be hardened by ultraviolet radiation and by heat, for example a suitable epoxy adhesive.

Then, using a syringe, a bead of adhesive 16 is dispensed, in the liquid state, onto the periphery of the front face 4 of the carrier substrate 2.

Subsequently, a transfer and positioning tool places the encapsulation cover 10, equipped with the optical element 13, in a reference position established with respect to a fixed position of the carrier substrate 2 and of the chip 6 mounted on the carrier substrate 2, while implementing a detection tool designed to detect the positioning pattern 20, through the back of the encapsulation cover 10.

Then, starting from the reference position and under the effect of a suitable motion program, the transfer and positioning tool brings and mounts the encapsulation cover 10 equipped with the optical element 13 on top of the carrier substrate 2, in the installed position previously described, the bead of adhesive 16 then being squashed.

Subsequently, the bead of adhesive 16 is made to harden so as to fix the encapsulation cover onto the carrier substrate 2.

The electronic device 1 is then formed.

Figure 2:
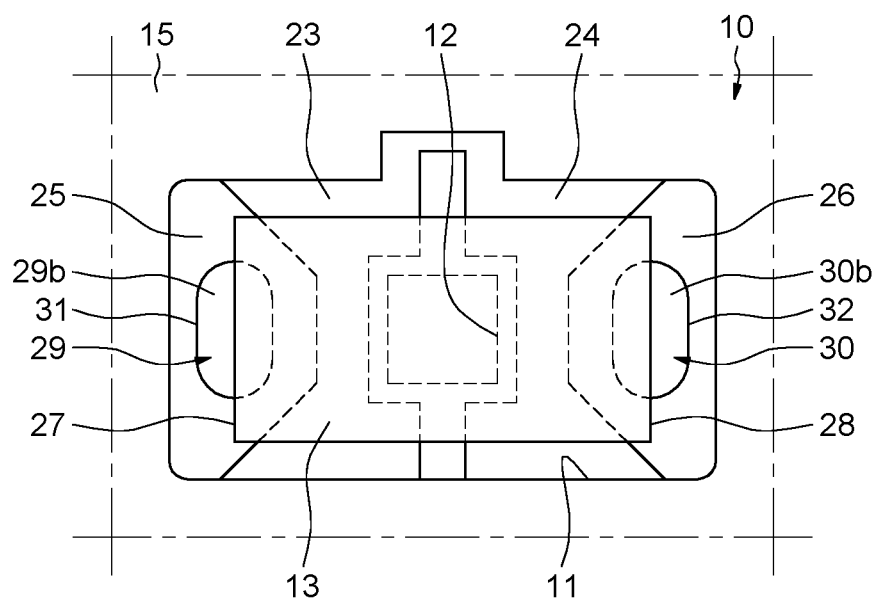
FIG. 2 shows a view from the back towards the front of an encapsulation cover, equipped with an optical element, of the electronic device in FIG. 1.
Figure 3:
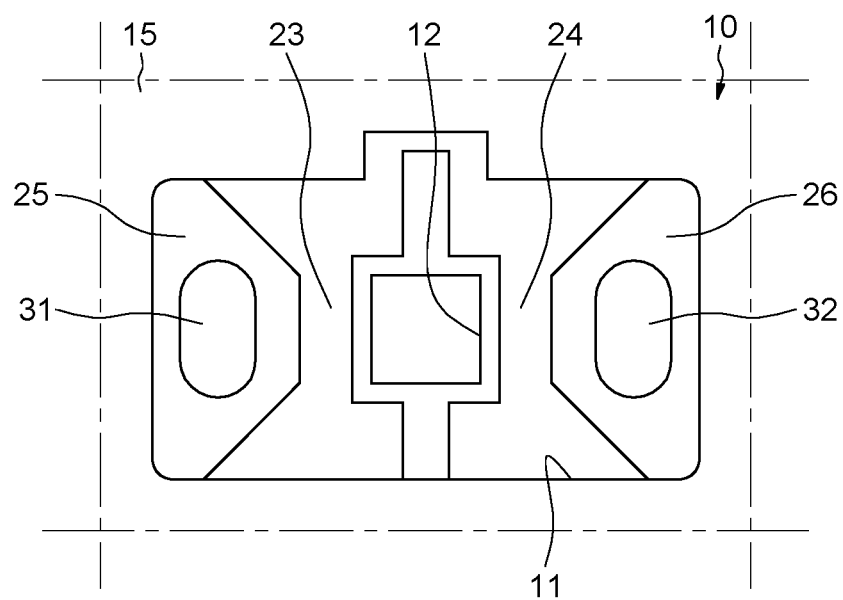
FIG. 3 shows a view from the back towards the front of the encapsulation cover, without the optical element.

According to one variant embodiment, an electronic device (not shown) comprises, generally speaking, two elementary electronic devices respectively equivalent to the electronic device 1 illustrated in FIGS. 1 to 3, one comprising an emitting chip specifically designed to emit light towards the outside and the other comprising a receiving chip specifically designed to capture the external light.

In this case, a common carrier substrate holds the emitting and receiving chips at a distance from one another.

A common encapsulation cover comprises a peripheral wall bonded on top of the periphery of the front face of the common carrier substrate and an internal partition which passes between and at a distance from the emitting and receiving chips and is bonded on top of the common carrier substrate and which bounds two internal chambers within which the emitting and receiving chips are respectively situated.

In front of the emitting and receiving chips, respectively, the common encapsulation cover has local front openings and carries specific optical elements, the optical element situated in front of the emitting chip comprising a central region designed to disperse the emitted light and the optical element situated in front of the receiving chip comprising a central region forming an optical lens.

In an equivalent manner to what has previously been described, the positioning patterns of the optical elements are implemented in order to mount these optical elements in desired positions on the common encapsulation cover and to mount, starting from a reference position, the common encapsulation cover on top of the common carrier substrate in a desired position.

According to one mode of operation, the emitting chip emits light radiation towards the outside and the receiving chip captures the external light radiation.

The electronic device thus formed may advantageously detect the presence or the absence of an object reflecting the light emitted by the emitting chip towards the receiving chip and hence may constitute a proximity detector.

According to one particular exemplary configuration, the electronic device thus formed is placed behind a transparent wall of a device, in a position such that this transparent wall is in front and at a short distance from the common encapsulation cover, the local openings being dimensioned to protect the receiving chip against the radiation from the emitting chip between the transparent wall of the device and the common encapsulation cover.

The electronic device thus formed may advantageously be installed inside a mobile telephone or an electronic tablet, behind a transparent wall.

The invention claimed is:

1. An electronic device, comprising:
   a carrier substrate having a front mounting face;
   an electronic chip mounted on the front mounting face of the carrier substrate, the electronic chip having, in its front face, an optical component;
   an encapsulation cover mounted on top of the front face of the carrier substrate and which bounds a chamber within which the electronic chip is situated, the encapsulation cover having a front opening situated in front of the optical component of the electronic chip; and
   an optical element, designed to allow light to pass, which covers the front opening of the encapsulation cover and which is mounted to the encapsulation cover within said chamber;
   wherein the optical element includes a central region designed to deviate the light, said central region having an optical axis aligned with the front opening, and further having a positioning pattern;
   wherein the encapsulation cover has, around the front opening, a back mounting face which comprises at least one contact area on which a front face of the optical element rests;
   wherein said back mounting face comprises at least one local cavity which is recessed with respect to the at least one contact area, said at least one local cavity forming spaces between the front face of the optical element and a bottom of the at least one local cavity, said at least one local cavity further extending beyond and being uncovered by one edge of the optical element; and
   at least one drop of adhesive for fixing the optical element to the back mounting face that extends locally into the at least one local cavity.

2. The device according to claim 1, wherein the positioning pattern is visible through the front opening.

3. The device according to claim 1, wherein the optical element comprises a base wafer and a back layer, and wherein the back layer is situated on a side of the optical element facing the electronic chip, and wherein the back layer includes said central region and said positioning pattern.

4. An electronic device, comprising:
   a carrier substrate having a front mounting face;
   an electronic chip mounted on the front mounting face of the carrier substrate, the electronic chip having, in its front face, an optical component;
   an encapsulation cover mounted on top of the front face of the carrier substrate and which bounds a chamber within which the electronic chip is situated, the encapsulation cover having a front opening situated in front of the optical component of the electronic chip; and
   an optical element, designed to allow light to pass, which covers the front opening of the encapsulation cover and which is mounted to the encapsulation cover within said chamber;
   wherein the encapsulation cover has, around the front opening, a back mounting face which comprises at least one contact area on which a front face of the optical element rests; and wherein said back mounting face comprises at least one local cavity which is recessed with respect to the at least one contact area, said at least one local cavity forming spaces between the front face of the optical element and a bottom of the at least one local cavity, said at least one local cavity further extending beyond and being uncovered by one edge of the optical element; and at least one drop of adhesive for fixing the optical element to the back mounting face that extends locally into the at least one local cavity.

5. The device according to claim 4, wherein the at least one drop of adhesive has a covered portion between the local cavity and the optical element and an uncovered portion which extends beyond the edge of the optical element.

6. The device according to claim 4, wherein the bottom of the at least one local cavity includes a protruding boss which extends facing and at a distance from the front face of the optical element, the drop of fixing adhesive extending over this protruding boss.

7. The device according to claim 6, wherein the protruding boss has a portion covered by the optical element and an uncovered portion situated beyond the edge of the optical element.

8. The device according to claim 4, wherein the at least one local cavity is situated at a distance from the front opening and separated from the front opening by the contact area.

9. An electronic device, comprising:
a carrier substrate having a front mounting face;
an electronic chip mounted on the front mounting face of the carrier substrate and including an optical component;
a cover mounted to the carrier substrate, said cover delimiting a chamber within which the electronic chip is situated, the cover having a front opening aligned with the optical component; and
a light passing optical element mounted at the front opening of the cover;
wherein the light passing optical element includes a central region designed to deviate the light towards the optical component and a positioning pattern that is visible through the front opening;
wherein the cover includes a back mounting face around the front opening, said back mounting face including a contact area on which a front face of the optical element rests;
wherein said back mounting face comprises a local cavity which is recessed with respect to the contact area to form spaces between the front face of the optical element and a bottom of the local cavity; and
a drop of adhesive located in the local cavity for securing the optical element to the back mounting face;
wherein the drop of adhesive has a covered portion between the local cavity and the optical element and an uncovered portion which extends beyond an edge of the optical element.

10. The device according to claim 9, wherein the optical element comprises multiple layers, and wherein said positioning pattern is included within one layer of said multiple layers.

11. The device according to claim 9, wherein the cover includes a back mounting face around the front opening, said back mounting face including a contact area on which a front face of the optical element rests.

12. The device according to claim 11, wherein said back mounting face comprises a local cavity which is recessed with respect to the contact area to form spaces between the front face of the optical element and a bottom of the local cavity.

13. The device according to claim 12, further comprising a drop of adhesive located in the local cavity for securing the optical element to the back mounting face.

14. The device according to claim 12, wherein said local cavity further extends beyond and is uncovered by an edge of the optical element.

15. The device according to claim 12, wherein the local cavity is situated at a distance from the front opening and separated from the front opening by the contact area.

16. An electronic device, comprising:
a carrier substrate having a front mounting face;
an electronic chip mounted on the front mounting face of the carrier substrate and including an optical component;
a cover mounted to the carrier substrate, said cover delimiting a chamber within which the electronic chip is situated, the cover having a front opening aligned with the optical component;
a light passing optical element mounted at the front opening of the cover;
wherein the cover includes a back mounting face around the front opening, said back mounting face including a contact area on which a front face of the optical element rests;
wherein said back mounting face comprises a local cavity which is recessed with respect to the contact area to form spaces between the front face of the optical element and a bottom of the local cavity; and
a drop of adhesive located in the local cavity for securing the optical element to the back mounting face; and
wherein the drop of adhesive has a covered portion between the local cavity and the optical element and an uncovered portion which extends beyond an edge of the optical element.

17. An electronic device, comprising:
a carrier substrate having a front mounting face;
an electronic chip mounted on the front mounting face of the carrier substrate and including an optical component;
a cover mounted to the carrier substrate, said cover delimiting a chamber within which the electronic chip is situated, the cover having a front opening aligned with the optical component; and
a light passing optical element mounted at the front opening of the cover;
wherein the cover includes a back mounting face around the front opening, said back mounting face including a contact area on which a front face of the optical element rests;
wherein said back mounting face comprises a local cavity which is recessed with respect to the contact area to form spaces between the front face of the optical element and a bottom of the local cavity; and
wherein the bottom of the local cavity includes a protruding boss which extends facing and at a distance from the front face of the optical element.

18. The device according to claim 17, further comprising a drop of adhesive located in the local cavity for securing the optical element to the back mounting face, said drop of fixing adhesive extending over the protruding boss.

19. The device according to claim 17, wherein the protruding boss has a portion covered by the optical element and a portion situated beyond an edge of the optical element.

* * * * *